(12) United States Patent
Kim et al.

(10) Patent No.: US 12,547,071 B2
(45) Date of Patent: Feb. 10, 2026

(54) SPIN COATER

(71) Applicant: Samsung Electronics Co., Ltd., Suwon-si (KR)

(72) Inventors: Sunghwan Kim, Suwon-si (KR); Kyungwon Kang, Suwon-si (KR); Dongwook Kim, Suwon-si (KR); Seungjoon Song, Suwon-si (KR); Seok Heo, Suwon-si (KR); Younseon Wang, Suwon-si (KR); Dasom Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 697 days.

(21) Appl. No.: 17/964,376

(22) Filed: Oct. 12, 2022

(65) Prior Publication Data

US 2023/0333467 A1    Oct. 19, 2023

(30) Foreign Application Priority Data

Apr. 19, 2022  (KR) .................. 10-2022-0048104

(51) Int. Cl.
  *G03F 7/00*  (2006.01)
  *G03F 7/30*  (2006.01)
  (Continued)

(52) U.S. Cl.
  CPC .......... *G03F 7/0025* (2013.01); *G03F 7/3021* (2013.01); *H01L 21/02282* (2013.01); *H01L 21/6715* (2013.01)

(58) Field of Classification Search
  CPC .......... G03F 7/0025; G03F 7/16; G03F 7/162; G03F 7/3021; H01L 21/02282;
  (Continued)

(56) References Cited

U.S. PATENT DOCUMENTS 6,328,807 B1  12/2001  Boek et al.
6,589,339 B2  7/2003  Takeshita et al.
(Continued)

FOREIGN PATENT DOCUMENTS

JP    2011035186 A    2/2011
KR    20130007503 U    12/2013
KR    102351350 B1    1/2022

OTHER PUBLICATIONS

Korean Office Action dated Nov. 28, 2023, issued in corresponding Korean Patent Application No. 10-2022-0048104.

*Primary Examiner* — Dah-Wei D. Yuan
*Assistant Examiner* — Stephen A Kitt
(74) *Attorney, Agent, or Firm* — Fish & Richardson P.C.

(57) ABSTRACT

A spin coater may include a spin chuck, a nozzle, a first temperature controller and a second temperature controller. The spin chuck may be configured make contact with a central portion of a lower surface of a substrate and may be configured to rotate the substrate when photoresist is on the substrate. The nozzle may be arranged over a central portion of the spin chuck and configured to provide a central portion of an upper surface of the substrate with photoresist. The first temperature controller may be configured to control a temperature in a first region of the spin chuck. The second temperature controller may be configured to control a temperature in a second region of the spin chuck.

18 Claims, 12 Drawing Sheets

(51) Int. Cl.
*H01L 21/02* (2006.01)
*H01L 21/67* (2006.01)

(58) Field of Classification Search
CPC ....... H01L 21/6715; H01L 2224/03416; H01L 2224/11416; H01L 2224/27416; H01L 2224/75181; H01L 2224/76181; H01L 2224/77181; H01L 2224/79181; B05C 11/08

See application file for complete search history.

(56) References Cited

U.S. PATENT DOCUMENTS

| | | |
|---|---|---|
| 7,238,239 B2 | 7/2007 | Daggett et al. |
| 2003/0205196 A1* | 11/2003 | Kitano .................... G03F 7/162 427/240 |
| 2005/0029244 A1 | 2/2005 | Ito et al. |
| 2005/0175775 A1* | 8/2005 | Shirley .................. G03F 7/162 118/624 |
| 2015/0114561 A1* | 4/2015 | Higashijima ....... H01L 21/6715 156/345.23 |
| 2017/0372928 A1 | 12/2017 | Yamada et al. |
| 2019/0198363 A1* | 6/2019 | Shimai .............. H01L 21/67051 |
| 2020/0107404 A1* | 4/2020 | Morita .............. H01L 21/67028 |
| 2021/0134629 A1 | 5/2021 | Koizumi et al. |
| 2022/0013387 A1 | 1/2022 | Yamada et al. |

\* cited by examiner

SPIN COATER

CROSS-REFERENCE TO RELATED APPLICATION

This application claims priority under 35 USC § 119 to Korean Patent Application No. 10-2022-0048104, filed on Apr. 19, 2022 in the Korean Intellectual Property Office (KIPO), the contents of which are herein incorporated by reference in their entirety.

BACKGROUND

1. Field

Example embodiments relate to a spin coater. More particularly, example embodiments relate to a spin coater configured to coat a photoresist on a semiconductor substrate rotated by a spin chuck.

2. Description of the Related Art

To transcribe a pattern into a layer on a semiconductor substrate, a photoresist solution may be coated on an upper surface of the semiconductor substrate. The photoresist solution may be provided to a central portion of the upper surface of the semiconductor substrate rotated by a spin chuck. The photoresist solution on the central portion of the upper surface of the semiconductor substrate may spread to an edge portion of the upper surface of the semiconductor substrate by a centrifugal force of the rotating semiconductor substrate.

According to related arts, the photoresist solution coated on the upper surface of the semiconductor substrate may have a thickness gradient. The thickness gradient may cause an error of the pattern transcription. Particularly, a thickness gradient of the photoresist solution on the central portion of the upper surface of the semiconductor substrate in an initial stage during a photoresist coating process may result in a large thickness gradient in a next stage.

SUMMARY

Example embodiments provide a spin coater that may be capable of reducing a thickness gradient of a photoresist coated on a central portion of an upper surface of a substrate.

According to example embodiments, a spin coater may include a spin chuck, a nozzle, a first temperature controller, and a second temperature controller. The spin chuck may be configured to make contact with a central portion of a lower surface of a substrate. The spin chuck may be configured to rotate the substrate when photoresist is coated on the substrate. The nozzle may be over a central portion of the spin chuck and configured to provide a central portion of an upper surface of the substrate with the photoresist. The first temperature controller may be configured to control a temperature in a first region of the spin chuck. The second temperature controller may be configured to control a temperature in a second region of the spin chuck.

According to example embodiments, a spin coater may include a spin chuck, a nozzle, a first temperature controller, a second temperature controller, a thickness sensor, and a main controller. The spin chuck may be configured to make contact with a central portion of a lower surface of a substrate and may be configured to rotate the substrate when photoresist is on the substrate. The nozzle may be over a central portion of the spin chuck and configured to provide a central portion of an upper surface of the substrate with the photoresist. The first temperature controller may be configured to control a temperature in an edge region of the spin chuck. The second temperature controller may be configured to control a temperature in a central region of the spin chuck. The thickness sensor may measure a thickness of the photoresist on the upper surface of the substrate. The main controller may control operations of the first temperature controller and the second temperature controller in accordance with the thickness of the photoresist measured by the thickness sensor. The first temperature controller may include four first non-contact type power supply devices, four first thermoelectric elements, and four first transfer members. The four first non-contact type power supply devices may be spaced apart from each other by a same gap with respect to a center of the spin chuck. The four first thermoelectric elements may be in the spin chuck. The four first thermoelectric elements may be configured receive a first power from the four first non-contact type power supply devices, respectively, and may be configured to generate a hot air or a cold air. The four first transfer members may extend from the center of the spin chuck and may be connected the four first thermoelectric elements and the edge region of the spin chuck. The four first transfer members may be configured to transfer the hot air or the cold air to the edge region of the spin chuck. The second temperature controller may include four second non-contact type power supply devices, four second thermoelectric elements, and four second transfer members. The four second non-contact type power supply devices may be spaced apart from each other by a same gap amount with respect to the center of the spin chuck. The four second thermoelectric elements may be in the spin chuck. The four second thermoelectric elements may be configured to receive a second power from the four second non-contact type power supply devices, respectively, and may be configured to generate a hot air or a cold air. The four second transfer members may extend from the center of the spin chuck through a space between the four first transfer members, respectively. The four second transfer members may be connected between the four second thermoelectric elements and the central region of the spin chuck. The four second transfer members may be configured to transfer the hot air or the cold air to the central region of the spin chuck.

According to example embodiments, a spin coater may include a spin chuck, a nozzle, a first temperature controller, a second temperature controller, a thickness sensor, and a main controller. The spin chuck may be configured to make contact with a central portion of a lower surface of a substrate and may be configured to rotate the substrate when photoresist is on the substrate. The nozzle may be over a central portion of the spin chuck and configured to provide a central portion of an upper surface of the substrate with the photoresist. The first temperature controller may be configured to control a temperature in an edge region of the spin chuck. The second temperature controller may be configured to control a temperature in a central region of the spin chuck. The thickness sensor may measure a thickness of the photoresist on the upper surface of the substrate. The main controller may control operations of the first temperature controller and the second temperature controller in accordance with the thickness of the photoresist measured by the thickness sensor. The first temperature controller may include four first non-contact type power supply devices, four first thermoelectric elements, and four first transfer members. The four first non-contact type power supply devices may be spaced apart from each other by a same gap with respect to a center of the spin chuck. The four first thermoelectric elements may be in the spin chuck. The four first thermoelectric elements may be configured receive a first power from the four first non-contact type power supply devices, respectively, and may be configured to generate a hot air or a cold air. The four first transfer members may extend from the center of the spin chuck and may be connected the four first thermoelectric elements and the edge region of the spin chuck. The four first transfer members may be configured to transfer the hot air or the cold air to the edge region of the spin chuck. The second temperature controller may include four second non-contact type power supply devices, four second thermoelectric elements, and four second transfer members. The four second non-contact type power supply devices may be spaced apart from each other by a same gap amount with respect to the center of the spin chuck. The four second thermoelectric elements may be in the spin chuck. The four second thermoelectric elements may be configured to receive a second power from the four second non-contact type power supply devices, respectively, and may be configured to generate a hot air or a cold air. The four second transfer members may extend from the center of the spin chuck through a space between the four first transfer members, respectively. The four second transfer members may be connected between the four second thermoelectric elements and the central region of the spin chuck. The four second transfer members may be configured to transfer the hot air or the cold air to the central region of the spin chuck. Each of the four first non-contact type power supply devices may include a first power transmitter positioned by the spin chuck, and a first power receiver in the spin chuck, the first power receiver electrically connected with a corresponding first thermoelectric element among of the four first thermoelectric elements and configured to receive the first power from the first power transmitter. Each of the four second non-contact type power supply devices may include a second power transmitter by the spin chuck, and a second power receiver in the spin chuck, the second power receiver electrically connected with a corresponding second thermoelectric element among the four second thermoelectric elements and configured to receive the second power from the second power transmitter. Each of the four first transfer members may include a first main transfer member extending from the center of the spin chuck into the edge region of the spin chuck along a radial direction of the spin chuck, a plurality of first sub-transfer members extending from the first main transfer member into the edge region of the spin chuck, and a plurality of first connection members connected between both ends of the plurality of first sub-transfer members. Each of the second transfer members may include a second main transfer member extending from the center of the spin chuck into the central region of the spin chuck along the radial direction of the spin chuck, a plurality of second sub-transfer members extending from the second main transfer member into the central region of the spin chuck, and a plurality of second connection members connected between both ends of the plurality of second sub-transfer members.

According to example embodiments, the first and second temperature controllers may independently control the temperatures of the edge region and the central region in the spin chuck in accordance with the thickness of the photoresist coated on the central portion of the upper surface of the substrate. Thus, the temperatures of the edge region and the central region in the spin chuck may have influence on the photoresist on the central portion of the upper surface of the substrate to reduce a thickness gradient of the photoresist. As a result, the photoresist may have a uniform thickness to decrease an error of a pattern transcription.

BRIEF DESCRIPTION OF THE DRAWINGS

Example embodiments will be more clearly understood from the following detailed description taken in conjunction with the accompanying drawings. FIGS. 1 to 10 represent non-limiting, example embodiments as described herein.

FIG. 1 is a cross-sectional view illustrating a spin coater in accordance with example embodiments;

FIG. 2 is a plan view illustrating a spin chuck of the spin coater in FIG. 1;

FIG. 3 is a cross-sectional view taken along a line A-A' in FIG. 2;

FIG. 4 is a cross-sectional view taken along a line B-B' in FIG. 2;

FIG. 5 is a cross-sectional view illustrating a Peltier element;

FIG. 6 is a view illustrating a capillary force between internal components of a photoresist;

FIG. 9 is a view illustrating a force applied to internal gradients of a photoresist in a spin coating process; and FIG. 10 is a flow chart illustrating a method of coating a photoresist using the spin coater in FIG. 1.

DETAILED DESCRIPTION

Hereinafter, example embodiments will be explained in detail with reference to the accompanying drawings.

Figure 1:
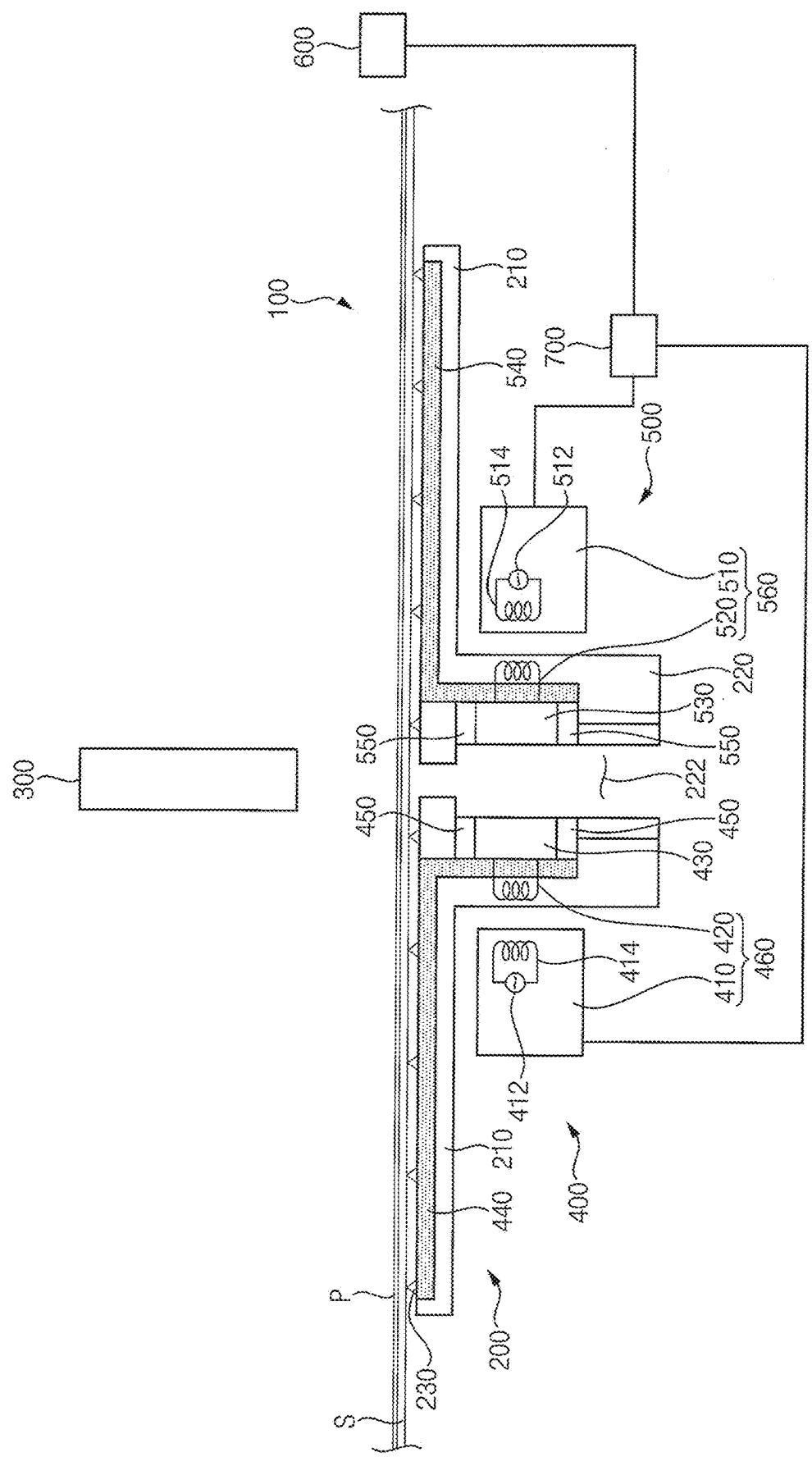
Figure 2:
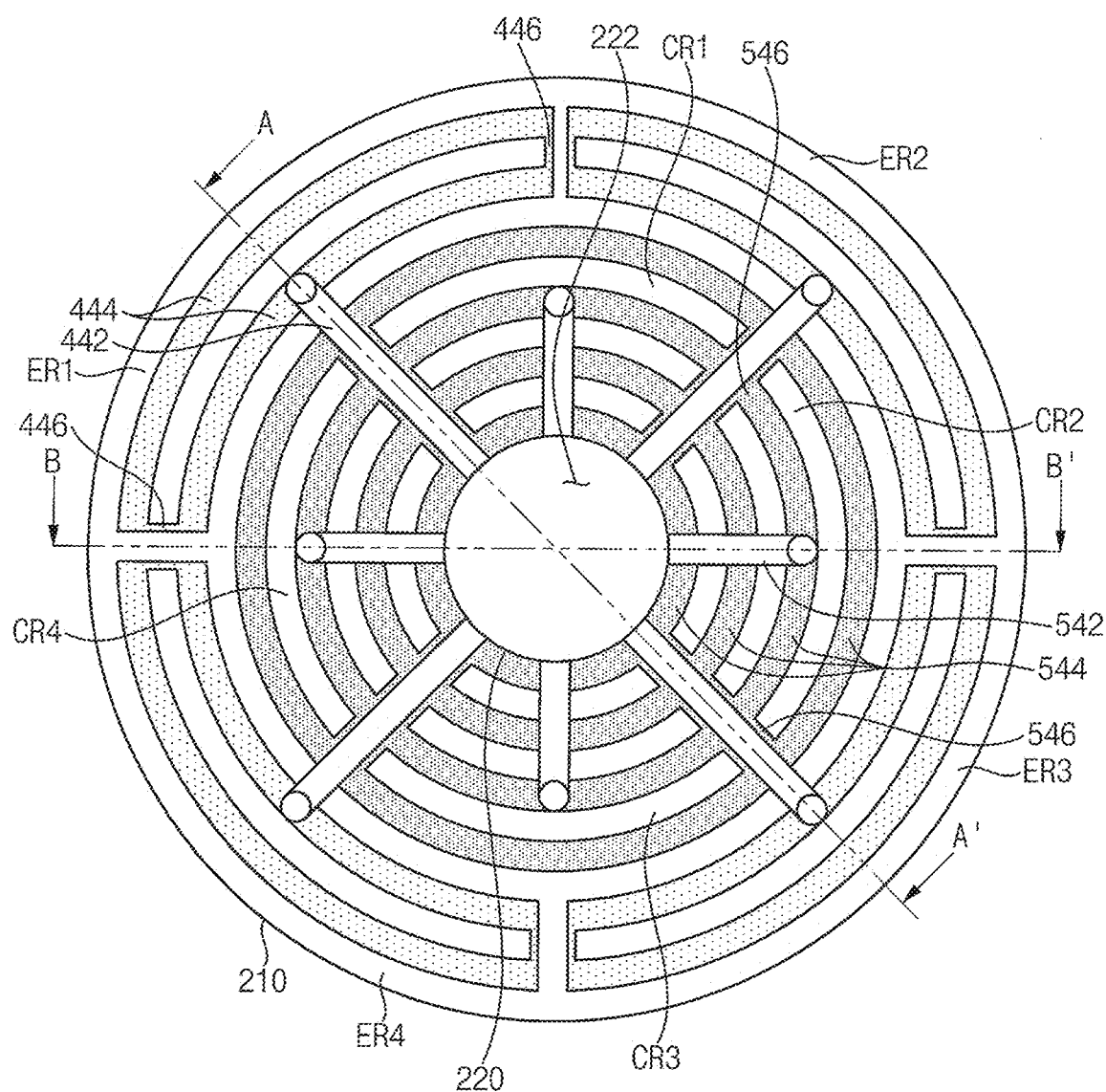
Figure 3:
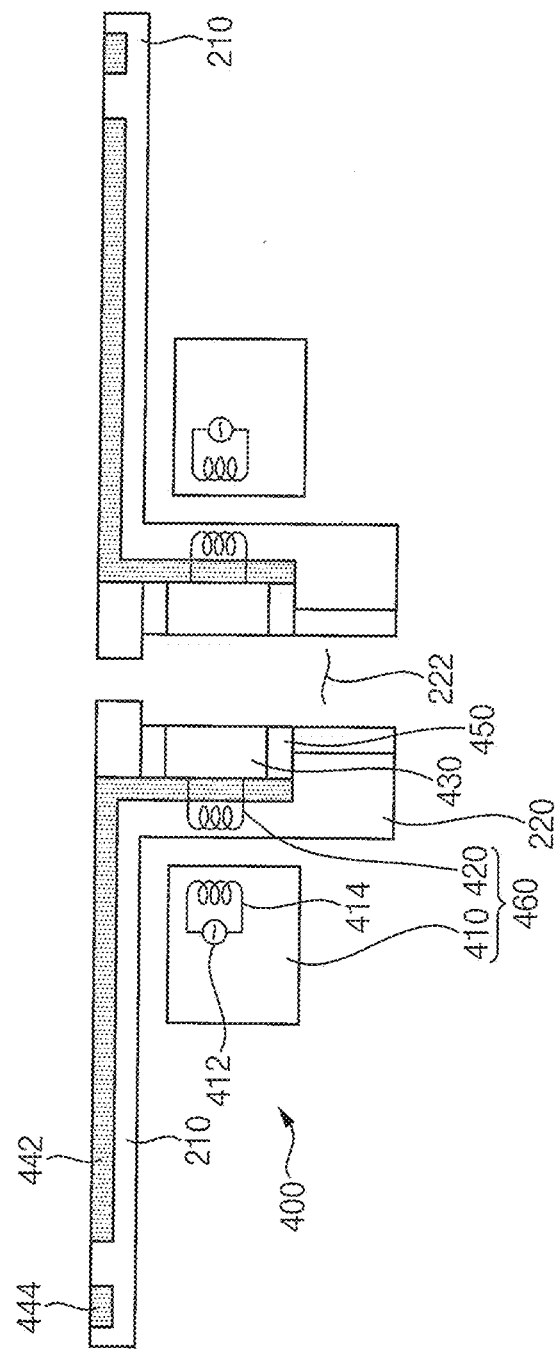
Figure 4:
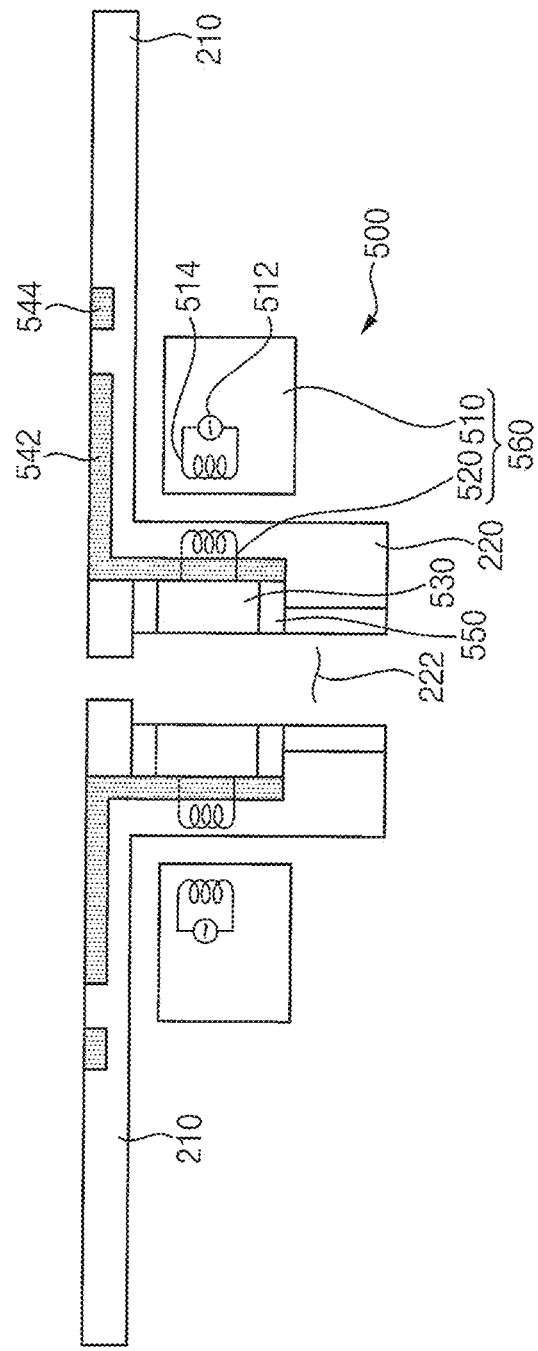

FIG. 1 is a cross-sectional view illustrating a spin coater in accordance with example embodiments, FIG. 2 is a plan view illustrating a spin chuck of the spin coater in FIG. 1, FIG. 3 is a cross-sectional view taken along a line A-A' in FIG. 2 and FIG. 4 is a cross-sectional view taken along a line B-B' in FIG. 2.

Referring to FIGS. 1 to 4, a spin coater 100 of example embodiments may include a spin chuck 200, a nozzle 300, a first temperature controller 400, a second temperature controller 500, a thickness sensor 600 and a main controller 700.

The spin chuck 200 may be configured to rotate a substrate S. The substrate S may include a semiconductor substrate, a glass substrate, etc. The spin chuck 200 may be rotated by an actuator such as a motor with respect to a vertical axis.

The spin chuck 200 may include a rotation plate 210 and a rotation shaft 220. The actuator may be connected to a lower end of the rotation shaft 220. Thus, a rotary force generated from the actuator may be transferred to the rotation shaft 220. The rotation plate 210 may be arranged on an upper end of the rotation shaft 220. The rotation plate 210 may also be rotated with respect to the vertical axis by the rotation of the rotation shaft 220. Further, the rotation shaft 220 may have an exhaust passage 222. The exhaust passage 222 may be vertically formed through the rotation shaft 220. The substrate S may be placed on an upper surface of the rotation plate 210. A plurality of fixing pins 230 configured to fix the substrate S may be arranged on the upper surface of the rotation plate 210.

In example embodiments, the spin chuck 200 may be classified into at least one first region and at least one second region. That is, the upper surface of the rotation plate 210 may be classified into the at least one first region and the at least one second region. The first region may correspond to an edge region of the rotation plate 210. The second region may correspond to a central region of the rotation plate 210. Thus, the first region may have a ring shape configured to surround the second region.

In example embodiments, the edge region of the rotation plate 210 may be classified into a first edge region ER1, a second edge region ER2, a third edge region ER3 and a fourth edge region ER4. The first to fourth edge regions ER1, ER2, ER3 and ER4 may be defined by two first diameter lines substantially perpendicular to each other. Alternatively, the edge region of the rotation plate 210 may be classified into two, three or at least five edge regions.

The central region of the rotation plate 210 may be classified into a first central region CR1, a second central region CR2, a third central region CR3 and a fourth central region CR4. The first to fourth central regions CR1, CR2, CR3 and CR4 may be defined by two second diameter lines substantially perpendicular to each other. The second diameter lines may be substantially perpendicular to the first diameter lines, not limited thereto. Further, the central region of the rotation plate 210 may be classified into two, three or at least five central regions.

The nozzle 300 may be arranged over the central region of the upper surface of the spin chuck 200. The nozzle 300 may be configured to provide the central region of the upper surface of the substrate S with a photoresist P. Because the substrate S may be rotated by the spin chuck 200, the photoresist P on the central region of the upper surface of the substrate S may spread to the edge region of the substrate S by a centrifugal force of the substrate S.

The first temperature controller 400 may control the first region of the spin chuck 200, e.g., the edge region of the spin chuck 200. In example embodiments, because the edge region of the spin chuck 200 may be classified into the first to fourth edge regions ER1, ER2, ER3 and ER4, the first temperature controller 400 may include four controllers corresponding to the first to fourth edge regions ER1, ER2, ER3 and ER4. That is, numbers of the first temperature controller 400 may correspond to numbers of the edge regions of the spin chuck 200.

The first temperature controller 400 may include a first non-contact type power supply device 460, a first thermoelectric element 430, a first transfer member 440 and a first adiabatic member 450.

The first non-contact type power supply device 460 may include a first power transmitter 410 and a first power receiver 420. The first power transmitter 410 may be positioned adjacent to the spin chuck 200. Particularly, the first power transmitter 410 may be positioned adjacent to the rotation shaft 220 of the spin chuck 200. The first power transmitter 410 may include a first power supply 412 (e.g., power circuitry, battery) and a first transmission coil 414. The first power supply 412 may be configured to generate a first power. The first transmission coil 414 may be positioned adjacent to the rotation shaft 220.

The first power receiver 420 may be arranged in the rotation shaft 220 of the spin chuck 200. Thus, the first power receiver 420 may be rotated together with the spin chuck 200. The first power receiver 420 may include a first reception coil. The first power receiver 420 may be positioned adjacent to the first power transmitter 410. However, the first power receiver 420 may not be directly connected to the first power transmitter 410. Thus, the first power generated from the first power transmitter 410 may be transmitted to the first power receiver 420 by a non-contact transmission way. The non-contact type transmission way may be achieved by providing the first power transmitter 410 and the first power receiver 420 with a same frequency.

The first thermoelectric element 430 may be arranged in the rotation shaft 220 of the spin chuck 200. The first power receiver 420 may be connected to the first thermoelectric element 430. Thus, the first thermoelectric element 430 may receive the first power through the first power receiver 420 to generate a hot air or a cold air. Further, the first thermoelectric element 430 may be exposed through the exhaust passage of the spin chuck 200.

Therefore, the first thermoelectric element 430 may heat or cool the edge region of the spin chuck 200. The first thermoelectric element 430 having the above-mentioned function may include a Peltier element.

Figure 5:
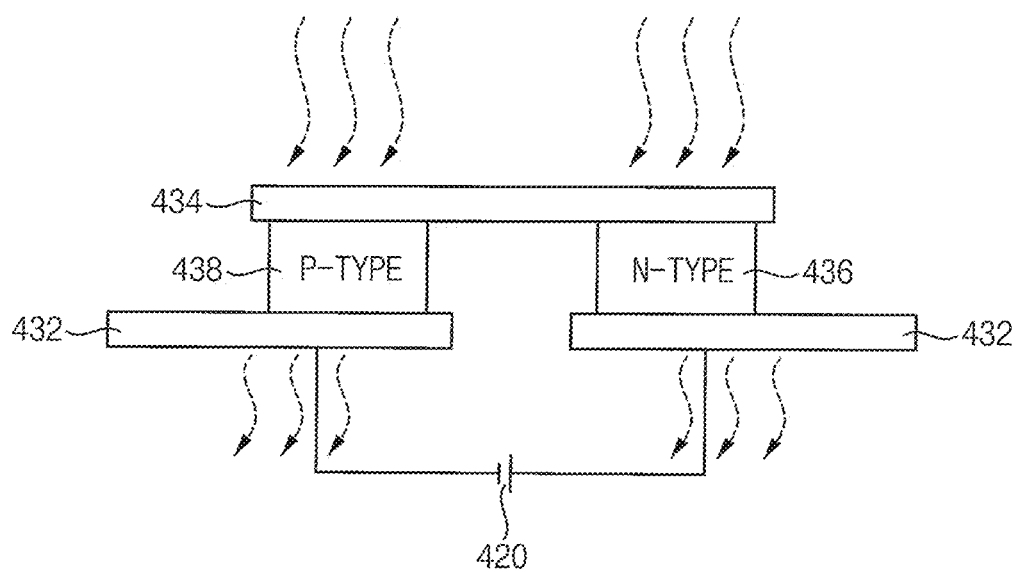

FIG. 5 is a cross-sectional view illustrating a Peltier element.

Referring to FIG. 5, the Peltier element may include first and second heat dissipation plates 432, a heat absorption plate 434 facing the first and second heat dissipation plates 432 and an N type semiconductor device 436 and a P type semiconductor device 438 interposed between the heat absorption plate 434 and the first and second heat dissipation plates 432. The first power receiver 420 may be electrically connected with the first and second heat dissipation plates 432.

A current may be supplied to the first heat dissipation plate 432 from the first power receiver 420. The current may be supplied to the second heat dissipation plate 432 through the N type semiconductor device 436, the heat absorption plate 434 and the P type semiconductor device 438. Heat may be dissipated from the first and second heat dissipation plates 432. The heat may be absorbed in the heat dissipation plate 434.

The Peltier effect may be explained as a principle that an ideal gas is cooled down by a constant entropy expansion. When an electron moves from a semiconductor having a high electron concentration to a semiconductor having a low electron concentration, an electron gas may expand and then works with respect to a potential barrier between two plates having a substantially same chemical potential, thereby electrically cooling down an object. The object may be cooled down at a temperature of about 195° F. using the Peltier effect.

Referring again to FIGS. 1 to 4, the first transfer member 440 may be arranged in the spin chuck 200. The first transfer member 440 may transfer the hot air or the cold air generated from the first thermoelectric element 430 to the edge region of the spin chuck 200. Thus, the first transfer member 440 may make contact with the first thermoelectric element 430. The first transfer member 440 may extend into the rotation plate 210 from the rotation shaft 220 of the spin chuck 200. The hot air or the cold air applied to the edge region of the spin chuck 200 through the first transfer member 440 may be exhausted through the exhaust passage 222 of the spin chuck 200.

In example embodiments, the first transfer member 440 may be exposed through the upper surface of the spin chuck 200. Thus, the exposed upper surface of the first transfer member 440 may be adjacent to a lower surface of the substrate S to improve efficiency for transferring the hot air or the cold air generated from the first thermoelectric element 430 to the edge region of the spin chuck 200. Alternatively, the first transfer member 440 may be built in the spin chuck 200. In this case, the first transfer member 440 may not be exposed through the upper surface of the spin chuck 200.

Because the edge region of the spin chuck 200 may be classified into the first to fourth edge regions ER1, ER2, ER3 and ER4, the first transfer member 440 may also include four members corresponding to the four edge regions. That is, numbers of the first transfer member 440 may correspond to the numbers of the edge region of the spin chuck 200. Further, an angle between the first transfer members 440 may be substantially equal to each other, not limited thereto.

The first transfer member 440 may have a solid structure. For example, the first transfer member 440 may include a solid metal pipe having a high thermal conductivity. Alternatively, the first transfer member 440 may include a heat pipe. The heat pipe may include a vacuum tube and a liquid in the vacuum tube. The heat pipe may transfer the heat more than the heat transferred by the solid metal pipe.

The first transfer member 440 may include a first main transfer member 442, a plurality of first sub-transfer members 444 and a plurality of first connection members 446. The first main transfer member 442, first sub-transfer members 444, and first connection members 446 may be different portions of the solid structure (e.g., solid metal pipe or heat pipe) constituting the first transfer member 440 and may be in fluid communication with each other. The first main transfer member 442 may be configured to make contact with the first thermoelectric element 430. Particularly, the first main transfer member 442 may be connected to an outer surface of the first thermoelectric element 430. The first main transfer member 442 may extend from a center of the spin chuck 200 to the edge region of the spin chuck 200 along a radial direction of the spin chuck 200. The first main transfer member 442 may include a plurality of members spaced apart from each other by a same angle with respect to the center of the spin chuck 200.

The first sub-transfer members 444 may extend from the first main transfer member 442 into the edge region of the spin chuck 200. The first sub-transfer members 444 may be uniformly distributed in the edge region of the spin chuck 200 to uniformly provide the edge region of the spin chuck 200 with the hot air or the cold air of the first main transfer member 442. In example embodiments, the first sub-transfer members 444 may be arranged in first circumferential lines of the spin chuck 200 crossing the edge region of the spin chuck 200, not limited thereto. For example, the first sub-transfer members 444 may be arranged in a direction substantially perpendicular to the radial direction of the spin chuck 200. Further, the first sub-transfer members 444 may include two sub-members, not limited thereto.

The first connection members 446 may be connected between the both ends of the first sub-transfer members 444. Because the first main transfer member 442 may be connected to any one of the first sub-transfer members 444, the first connection members 446 may transfer the hot air or the cold air of the first main transfer member 442 to all the first sub-transfer members 444. In example embodiments, because the first sub-transfer members 444 may be arranged in the first circumferential lines of the spin chuck 200, the first connection members 446 may extend in the radial direction of the spin chuck 200, not limited thereto.

The first adiabatic member 450 may be on the first thermoelectric element 430. The first adiabatic member 450 may limit and/or prevent the hot air or the cold air generated from the first thermoelectric element 430 from being transferred to the spin chuck 200 through the upper and lower surfaces of the first thermoelectric element 430. Thus, the first adiabatic member 450 may be arranged on the upper and lower surfaces of the first thermoelectric element 430. The first adiabatic member 450 may include a material for limiting and/or preventing the hot air or the cold air from being transferred therethrough.

The second temperature controller 500 may control the second region of the spin chuck 200, e.g., the central region of the spin chuck 200. In example embodiments, because the central region of the spin chuck 200 may be classified into the second to fourth central regions CR1, CR2, CR3 and CR4, the second temperature controller 500 may include four controllers corresponding to the second to fourth central regions CR1, CR2, CR3 and CR4. That is, numbers of the second temperature controller 500 may correspond to numbers of the central regions of the spin chuck 200.

The second temperature controller 500 may include a second non-contact type power supply device 560, a second thermoelectric element 530, a second transfer member 540 and a second adiabatic member 550.

The second non-contact type power supply device 560 may include a second power transmitter 510 and a second power receiver 520. The second power transmitter 510 may be positioned adjacent to the spin chuck 200. Particularly, the second power transmitter 510 may be positioned adjacent to the rotation shaft 220 of the spin chuck 200. The second power transmitter 510 may include a second power supply 512 (e.g., power circuitry, battery) and a second transmission coil 514. The second power supply 512 may be configured to generate a second power. The second power generated from the second power supply 512 may be different from the first power generated from the first power supply 412. The second transmission coil 514 may be positioned adjacent to the rotation shaft 220.

The second power receiver 520 may be arranged in the rotation shaft 220 of the spin chuck 200. Thus, the second power receiver 520 may be rotated together with the spin chuck 200. The second power receive 520 may include a second reception coil. The second power receiver 520 may be positioned adjacent to the second power transmitter 510. However, the second power receiver 520 may not be directly connected to the second power transmitter 510. Thus, the second power generated from the second power transmitter 510 may be transmitted to the second power receiver 420 by the non-contact transmission way. The frequency provided to the second power transmitter 510 and the second power receiver 520 may be different from the frequency provided to the first power transmitter 410 and the first power receiver 420. Thus, the first power of the first power transmitter 410 may be transmitted to only the first power receiver 420. The second power of the second power transmitter 510 may be transmitted to only the second power receiver 520.

The second thermoelectric element 530 may be arranged in the rotation shaft 220 of the spin chuck 200. The second power receiver 520 may be connected to the second thermoelectric element 530. Thus, the second thermoelectric element 530 may receive the second power through the second power receiver 520 to generate a hot air or a cold air. Further, the second thermoelectric element 530 may be exposed through the exhaust passage 222 of the spin chuck 200.

The second transfer member 540 may be arranged in the spin chuck 200. The second transfer member 540 may transfer the hot air or the cold air generated from the second thermoelectric element 530 to the central region of the spin chuck 200. Thus, the second transfer member 540 may make contact with the second thermoelectric element 530. The second transfer member 540 may extend into the rotation plate 210 from the rotation shaft 220 of the spin chuck 200. The second transfer member 540 may be connected to the central region of the spin chuck 200. The hot air or the cold air applied to the central region of the spin chuck 200 through the second transfer member 540 may be exhausted through the exhaust passage 222 of the spin chuck 200. The first transfer members 440 and the second transfer members 540 may extend in a cross shape In example embodiments, the second transfer member 540 may be exposed through the upper surface of the spin chuck 200. Thus, the exposed upper surface of the second transfer member 540 may be adjacent to the lower surface of the substrate S to improve efficiency for transferring the hot air or the cold air generated from the second thermoelectric element 530 to the central region of the spin chuck 200. Alternatively, the second transfer member 540 may be built in the spin chuck 200. In this case, the second transfer member 540 may not be exposed through the upper surface of the spin chuck 200.

In example embodiments, the second transfer member 540 may have a solid metal pipe. Alternatively, the second transfer member 540 may include a heat pipe.

Because the central region of the spin chuck 200 may be classified into the second to fourth central regions CR1, CR2, CR3 and CR4, the second transfer member 540 may also include four members corresponding to the four central regions. That is, numbers of the second transfer member 540 may correspond to the numbers of the central region of the spin chuck 200. Further, an angle between the second transfer members 540 may be substantially equal to each other, not limited thereto.

The second transfer member 540 may include a second main transfer member 542, a plurality of second sub-transfer members 544 and a plurality of second connection members 546. The second main transfer member 542, second sub-transfer members 544, and second connection members 546 may be different portions of the solid structure (e.g., solid metal pipe or heat pipe) constituting the second transfer member 540 and may be in fluid communication with each other. The second main transfer member 542 may be configured to make contact with the second thermoelectric element 530. Particularly, the second main transfer member 542 may be connected to an outer surface of the second thermoelectric element 530. The second main transfer member 542 may extend from the center of the spin chuck 200 to the central region of the spin chuck 200 along the radial direction of the spin chuck 200. The second main transfer member 542 may include a plurality of members spaced apart from each other by a same angle with respect to the center of the spin chuck 200. The second main transfer members 542 may be positioned between the first main transfer members 442.

The second sub-transfer members 544 may extend from the second main transfer member 542 into the central region of the spin chuck 200. The second sub-transfer members 544 may be uniformly distributed in the central region of the spin chuck 200 to uniformly provide the central region of the spin chuck 200 with the hot air or the cold air of the second main transfer member 542. In example embodiments, the second sub-transfer members 544 may be arranged in second circumferential lines of the spin chuck 200 crossing the central region of the spin chuck 200, not limited thereto. For example, the second sub-transfer members 544 may be arranged in a direction substantially perpendicular to the radial direction of the spin chuck 200. Further, the second sub-transfer members 544 may include two sub-members, not limited thereto.

The second connection members 546 may be connected between the both ends of the second sub-transfer members 544. Because the second main transfer member 542 may be connected to any one of the second sub-transfer members 444, the second connection members 546 may transfer the hot air or the cold air of the second main transfer member 542 to all the second sub-transfer members 544. In example embodiments, because the second sub-transfer members 544 may be arranged in the second circumferential lines of the spin chuck 200, the second connection members 546 may extend in the radial direction of the spin chuck 200, but example embodiments are not limited thereto.

The second adiabatic member 550 may be on the second thermoelectric element 530. The second adiabatic member 550 may be arranged on the upper and lower surfaces of the second thermoelectric element 530. The second adiabatic member 550 may include a material for limiting and/or preventing the hot air or the cold air from being transferred therethrough.

The thickness sensor 600 may measure a thickness of the photoresist P coated on the upper surface of the substrate S from the nozzle 300. Particularly, the thickness sensor 600 may measure a thickness of the photoresist P on the central region of the upper surface of the substrate S. The thickness sensor 600 may include an ellipsometer or other suitable sensor used for measuring the thickness of photoresist P.

The main controller 700 may receive the thickness of the photoresist P measured by the thickness sensor 600. The main controller 700 may control the operations of the first and second temperature controllers 400 and 500 in accordance with the thickness of the photoresist P.

In example embodiments, the spin chuck 200 may be classified into the edge region and the central region to independently control the edge region and the central region, not limited thereto. For example, the spin chuck 300 may be classified into the edge region, the central region and a middle region. The edge region, the central region and the middle region may be independently controlled using the three temperature controllers.

According to example embodiments, the temperatures of the edge region and the central region in the spin chuck may be independently controlled using the first and second temperature controllers 400 and 500 to control a capillary force, a convective force and a Marangoni effect applied to components in the photoresist P. Forces of the components in the photoresist P may be controlled by the temperature control to improve thickness uniformity of the photoresist P.

Figure 6:
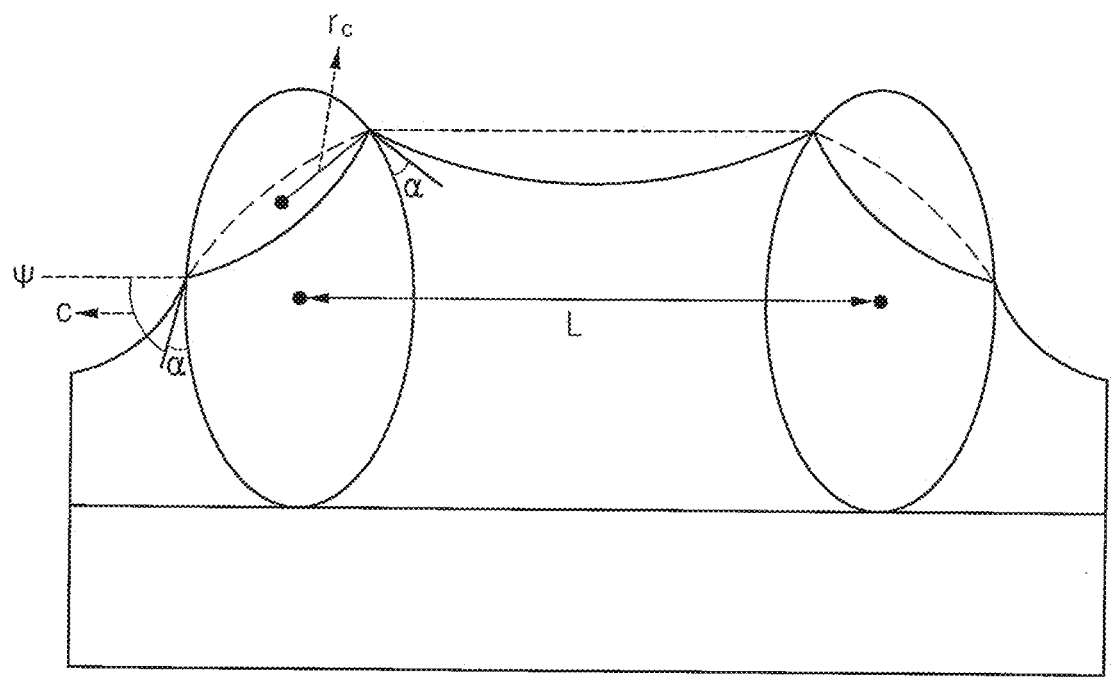
Figure 7A:
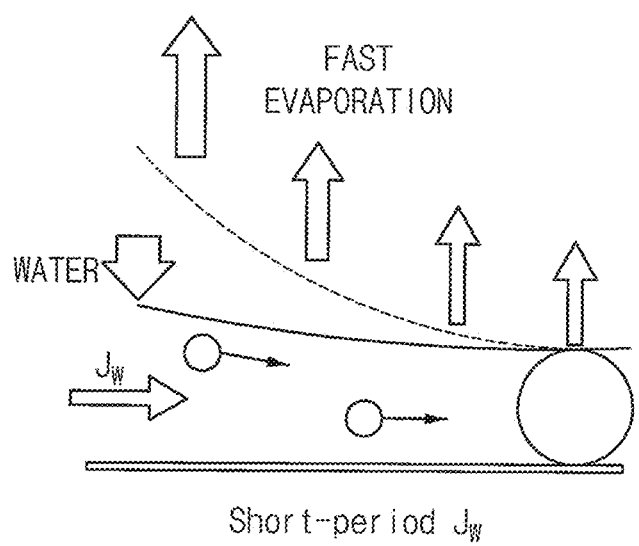
FIGS. 7A to 7D are views illustrating a convection force applied to internal components of a photoresist in accordance with an evaporation.
Figure 7B:
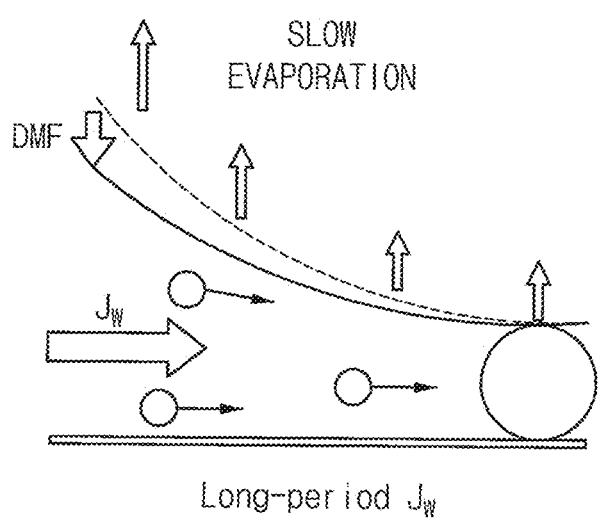
Figure 7C:
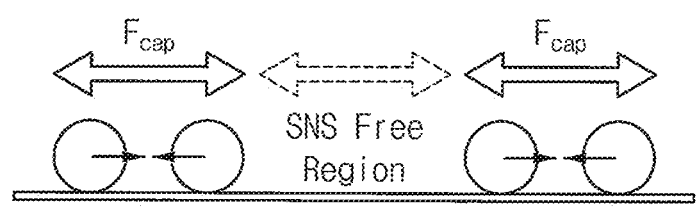
Figure 7D:
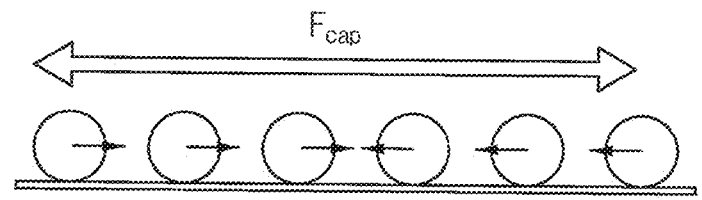
Figure 8A:
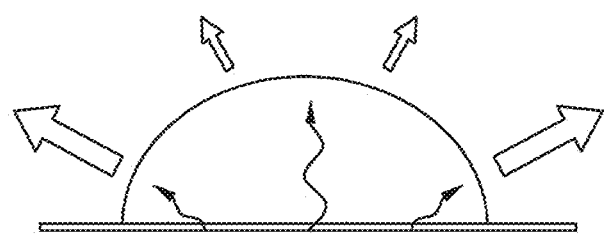
FIGS. 8A to 8D are views illustrating Marangoni effect in accordance with temperature differences on a contact surface of a photoresist.
Figure 8B:
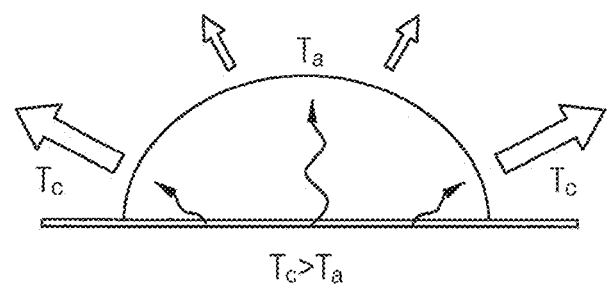
Figure 8C:
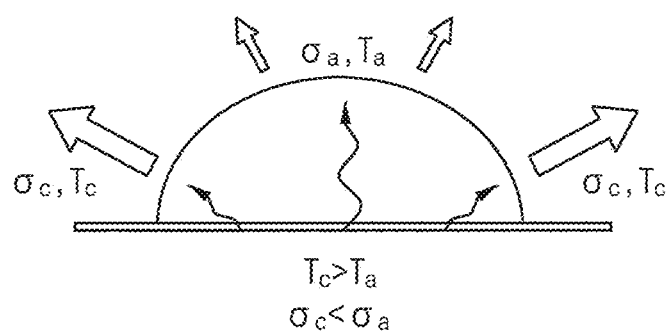
Figure 8D:
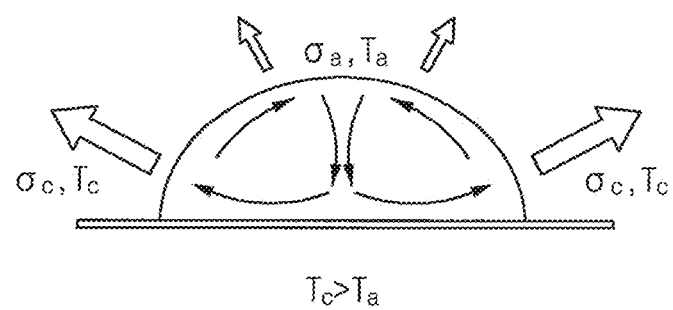

FIG. 6 is a view illustrating a capillary force between internal components of a photoresist.

Referring to FIG. 6, a capillary force Fx may be applied between the internal components. The capillary force Fx may be represented by following Formula.

$$F_x = 2\pi\sigma r_c^2 \frac{(\sin^2(\psi_c))}{L}$$

In the above Formula, $\sigma$ may be a surface tension of the photoresist, $r_c$ may be a radius of a contact surface between three phases, $\psi_c$ may be an inclined angle of a meniscus, L may be length between centers of two internal components (see FIG. 6). The capillary force may be affected by the surface tension. A magnitude and a time of the capillary force may be affected by a height of a liquid due to evaporation. Thus, an amount of the evaporation may control the capillary force. The evaporation amount may be controlled using a temperature.

FIGS. 7A to 7D are views illustrating a convection force applied to internal components of a photoresist in accordance with an evaporation.

Referring to FIGS. 7A to 7D, a convective force may be generated by a hydrodynamic pressure difference caused by a thickness difference of the photoresist. A planarization may be generated from a thick portion to a thin portion in the photoresist. When a sufficient evaporation time may not be secured, a section where the photoresist may not be coated may be sporadically generated. Thus, the thin thickness of the photoresist may require an accurate control of the evaporation amount. A main control factor of the convective force may be the evaporation amount. The convective force may be controlled using the temperature similarly to the capillary force. DMF in FIG. 7B refers to dimethyl formamide.

Figure 9:
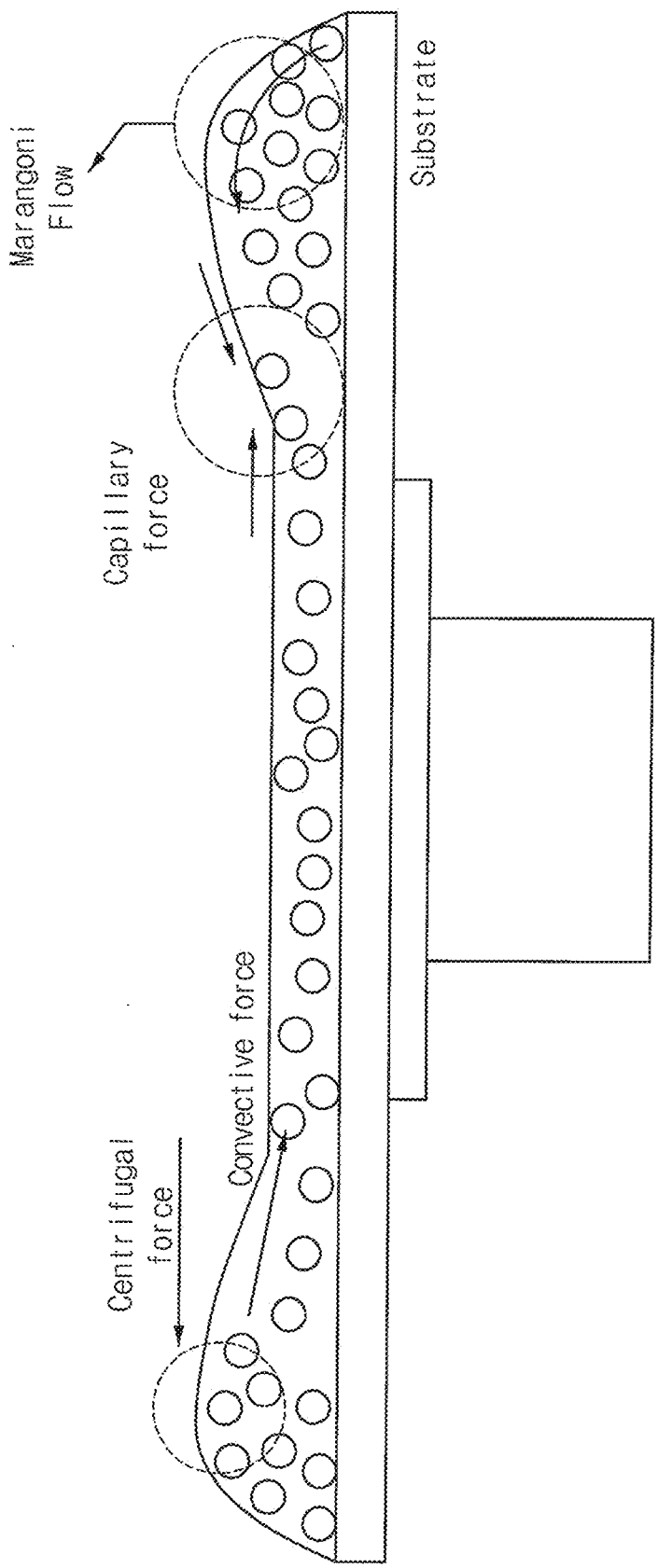

FIGS. 8A to 8D are views illustrating Marangoni effect in accordance with temperature differences on a contact surface of a photoresist and FIG. 9 is a view illustrating a force applied to internal gradients of a photoresist in a spin coating process.

Referring to FIGS. 8A to 8D and 9, the Marangoni effect may be an internal flow generated by a difference between the surface tensions. The Marangoni effect may be locally generated on the substrate, not all the surface of the substrate. Particularly, the Marangoni effect may be mainly generated at the edge regions of the substrate and the spin chuck.

Figure 10:
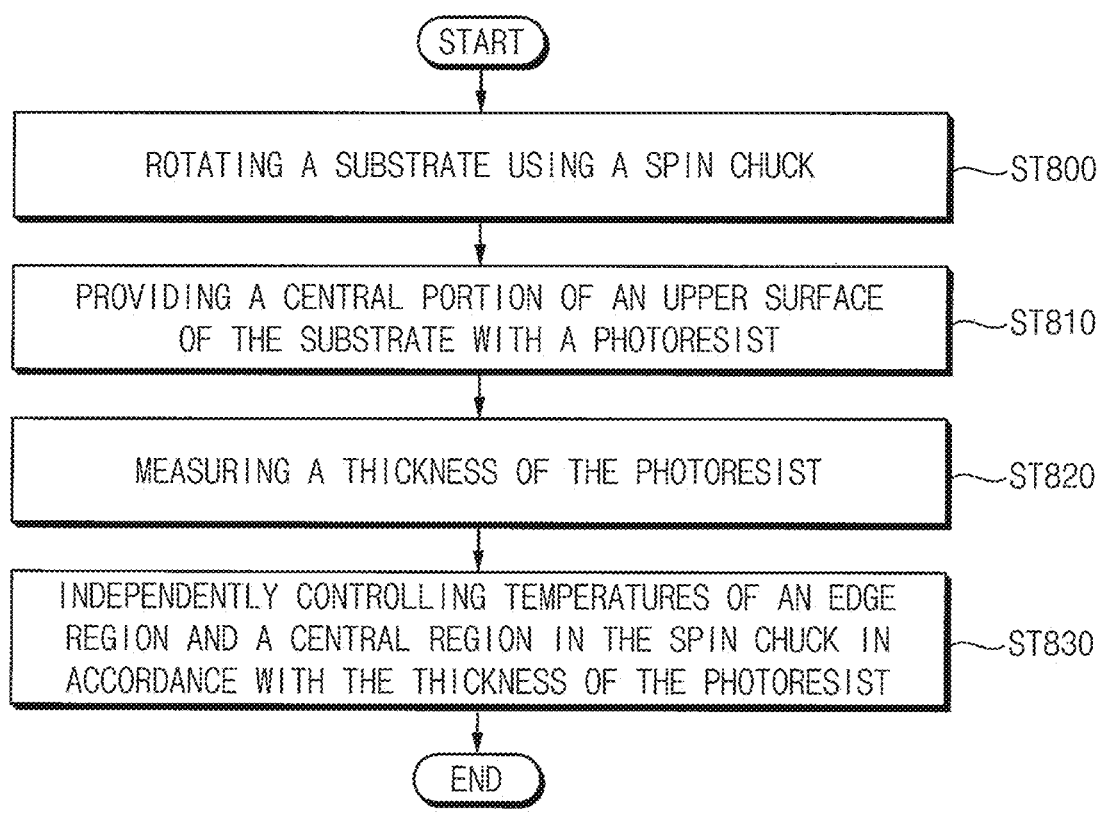

FIG. 10 is a flow chart illustrating a method of coating a photoresist using the spin coater in FIG. 1.

Referring to FIGS. 1 and 10, in operation 800, a substrate may be provided on the spin chuck 200 and rotated using the spin chuck 200. In operation ST810, the nozzle 300 may provide the central region of the upper surface of the substrate S with the photoresist P. The photoresist P may spread to the edge region of the upper surface of the substrate S by the centrifugal force of the spin chuck 200.

In operation ST820, the thickness sensor 600 may measure the thickness of the photoresist P coated on the upper surface of the substrate S. Particularly, the thickness sensor 600 may measure the thickness of the photoresist P on the central region of the upper surface of the substrate S making contact with the spin chuck 200. Information with respect to the thickness of the photoresist P measured by the thickness sensor 600, e.g., a thickness profile may be transmitted to the main controller 700.

In operation ST830, the main controller 700 may control the operations of the first and second temperature controllers 400 and 500 in accordance with the thickness of the photoresist P. Particularly, the operation control of the first and second temperature controllers 400 and 500 may be performed in an initial stage of the coating process. Thus, a thickness gradient of the photoresist P on the central region of the upper surface of the substrate S may be reduced in the initial stage.

For example, when it may be required to increase the temperature of the edge region of the spin chuck 200 more than (or compared to) the temperature of the central region of the spin chuck 200 based on the thickness profile of the photoresist P, the main controller 700 may control the first and second power transmitters 410 and 510 to provide the first power higher than the second power. Thus, the hot air generated from the first thermoelectric element 430 by the first power may be higher than the hot air generated from the second thermoelectric element 530 by the second power. As a result, the relatively hot air may be applied to the edge region compared to the central region to increase the temperature of the edge region more than (or compared to) the temperature of the central region.

In contrast, when it may be required to increase the temperature of the central region of the spin chuck 200 more than (or compared to) the temperature of the edge region of the spin chuck 200 based on the thickness profile of the photoresist P, the main controller 700 may control the first and second power transmitters 410 and 510 to provide the second power higher than the first power. Thus, the hot air generated from the second thermoelectric element 530 by the second power may be higher than the hot air generated from the first thermoelectric element 430 by the first power. As a result, the relatively hot air may be applied to the central region compared to the edge region to increase the temperature of the central region more than (or compared to) the temperature of the edge region.

When it may be required to decrease the temperature of the edge region of the spin chuck 200 more than (or compared to) the temperature of the central region of the spin chuck 200 based on the thickness profile of the photoresist P, the main controller 700 may control the first and second non-contact type power supply devices 460 and 560 to provide the temperature of the cold air generated from the first thermoelectric element 430 lower than the temperature of the cold air generated from the second thermoelectric element 530. Thus, the relatively cold air may be applied to the edge region compared to the central region to decrease the temperature of the edge region more than (or compared to) the temperature of the central region.

In contrast, when it may be required to decrease the temperature of the central region of the spin chuck 200 more than (or compared to) the temperature of the edge region of the spin chuck 200 based on the thickness profile of the photoresist P, the main controller 700 may control the first and second non-contact type power supply devices 460 and 560 to provide the temperature of the cold air generated from the second thermoelectric element 530 lower than the temperature of the cold air generated from the first thermoelectric element 430. Thus, the relatively cold air may be applied to the central region compared to the edge region to decrease the temperature of the central region more than (or compared to) the temperature of the edge region.

According to example embodiments, the first and second temperature controllers may independently control the temperatures of the edge region and the central region in the spin chuck in accordance with the thickness of the photoresist coated on the central portion of the upper surface of the substrate. Thus, the temperatures of the edge region and the central region in the spin chuck may have influence on the photoresist on the central portion of the upper surface of the substrate to reduce a thickness gradient of the photoresist. As a result, the photoresist may have a uniform thickness to decrease an error of a pattern transcription.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of embodiments of inventive concepts. Accordingly, all such modifications are intended to be included within the scope of the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A spin coater comprising:
a spin chuck configured to make contact with a central region of a lower surface of a substrate, the spin chuck configured to rotate the substrate when photoresist is on the substrate;
a nozzle over a central region of the spin chuck and configured to provide a central region of an upper surface of the substrate with the photoresist;
a first temperature controller configured to control a temperature of an edge region of the spin chuck; and
a second temperature controller configured to control a temperature of the central region of the spin chuck,
wherein the first temperature controller comprises a first thermoelectric element and a first transfer member configured to transfer heat from the first thermoelectric element,
wherein the second temperature controller comprises a second thermoelectric element and a second transfer member configured to transfer heat from the second thermoelectric element,
wherein the first transfer member comprises a first main transfer member extending from the central region of the spin chuck into the edge region of the spin chuck along a first radial direction of the spin chuck, and
wherein the second transfer member comprises a second main transfer member extending along a second radial direction from the central region of the spin chuck further into the central region of the spin chuck.

2. The spin coater of claim 1,
wherein the first temperature controller comprises a first non-contact type power supply device,
the first thermoelectric element is in the spin chuck,
the first thermoelectric element is configured to receive a first power from the first non-contact type power supply device to generate a first hot air or cold air, and
the first transfer member is configured to transfer the first hot air or cold air to the edge region, and
wherein the second temperature controller comprises a second non-contact type power supply device,
the second thermoelectric element is in the spin chuck,
the second thermoelectric element is configured to receive a second power from the second non-contact type power supply device to generate a second hot air or cold air, and
the second transfer member is configured to transfer the second hot air or cold air to the central second region.

3. The spin coater of claim 2, wherein
the spin chuck comprises an exhaust passage formed through the spin chuck to exhaust at least one of the first or second hot air or cold air, and
the first thermoelectric element and the second thermoelectric element are exposed through the exhaust passage.

4. The spin coater of claim 2, wherein
the first non-contact type power supply device comprises a first power transmitter positioned by the spin chuck and a first power receiver in the spin chuck,
the first power receiver is electrically connected with the first thermoelectric element and configured to receive the first power from the first power transmitter,
the second non-contact type power supply device comprises a second power transmitter positioned by the spin chuck and a second power receiver in the spin chuck, and
the second power receiver is electrically connected with the second thermoelectric element and to receive the second power from the second power transmitter.

5. The spin coater of claim 1, wherein
the first transfer member comprises a plurality of first main transfer members spaced apart from each other by a same angle with respect to a center of the spin chuck, and
the second transfer member comprises a plurality of second main transfer members between the plurality of first main transfer members and spaced apart from each other by a same angular amount with respect to the center of the spin chuck.

6. The spin coater of claim 1, wherein
the first transfer member further comprises a plurality of first sub-transfer members extending from the first main transfer member into the edge region of the spin chuck,
the first transfer member further comprises a plurality of first connection members connected between ends of the plurality of first sub-transfer members,
the second transfer member further comprises a plurality of second sub-transfer members extending from the second main transfer member into the central region of the spin chuck, and
the second transfer member further comprises a plurality of second connection members connected between ends of the plurality of second sub-transfer members.

7. The spin coater of claim 1, wherein
the first temperature controller further comprises a first adiabatic member on an upper surface of the first thermoelectric element and a lower surface of the first thermoelectric element, and
the second temperature controller further comprises a second adiabatic member on an upper surface of the second thermoelectric element and a lower surface of the second thermoelectric element.

8. The spin coater of claim 1, wherein the first transfer member and the second transfer member each comprise a solid pipe.

9. The spin coater of claim 1, wherein the first transfer member and the second transfer member each comprise a heat pipe.

10. The spin coater of claim 1, further comprising:
a thickness sensor configured to measure a thickness of the photoresist coated on the upper surface of the substrate; and
a main controller configured to control operations of the first temperature controller and the second temperature controller based on the thickness of the photoresist measured by the thickness sensor.

11. A spin coater comprising:
a spin chuck configured to make contact with a central region of a lower surface of a substrate, the spin chuck configured to rotate the substrate when photoresist is on the substrate;
a nozzle over a central region of the spin chuck and configured to provide a central region of an upper surface of the substrate with the photoresist;
a first temperature controller configured to control a temperature of an edge region of the spin chuck;
a second temperature controller configured to control a temperature of the central region of the spin chuck;
a thickness sensor configured to measure a thickness of the photoresist on the upper surface of the substrate; and
a main controller configured to control operations of the first temperature controller and the second temperature controller in accordance with the thickness of the photoresist measured by the thickness sensor,
wherein the first temperature controller includes
four first non-contact type power supply devices spaced apart from each other by a same gap with respect to a center of the spin chuck,
four first thermoelectric elements in the spin chuck, the four first thermoelectric elements configured to receive a first power from the four first non-contact type power supply devices, respectively, and configured to generate a first hot air or cold air, and
four first transfer members extending radially from the center of the spin chuck and connected between the four first thermoelectric elements and the edge region of the spin chuck, the four first transfer members configured to transfer the first hot air or cold air to the edge region of the spin chuck, and
wherein the second temperature controller includes
four second non-contact type power supply devices spaced apart from each other by a same gap amount with respect to the center of the spin chuck,
four second thermoelectric elements in the spin chuck, the four second thermoelectric elements configured to receive a second power from the four second non-contact type power supply devices, respectively, and configured to generate a second hot air or cold air, and
four second transfer members extending from the center of the spin chuck between the four first transfer members, respectively, and connected between the four second thermoelectric elements and the central region of the spin chuck, the four second transfer members configured to transfer the second hot air or cold air to the central region of the spin chuck.

12. The spin coater of claim 11,
wherein each of the four first non-contact type power supply devices comprises
a first power transmitter positioned by the spin chuck, and
a first power receiver in the spin chuck, the first power receiver electrically connected with a corresponding first thermoelectric element among of the four first thermoelectric elements and configured to receive the first power from the first power transmitter, and
wherein each of the four second non-contact type power supply devices comprises:
a second power transmitter by the spin chuck, and
a second power receiver in the spin chuck, the second power receiver electrically connected with a corresponding second thermoelectric element among the four second thermoelectric elements and configured to receive the second power from the second power transmitter.

13. The spin coater of claim 11,
wherein each of the four first transfer members comprises
a first main transfer member extending radially from the center of the spin chuck into the edge region of the spin chuck,
a plurality of first sub-transfer members extending from the first main transfer member into the edge region of the spin chuck, and
a plurality of first connection members connected between ends of the plurality of first sub-transfer members, and
wherein each of the four second transfer members comprises
a second main transfer member extending radially from the center of the spin chuck into the central region of the spin chuck,
a plurality of second sub-transfer members extending from the second main transfer member into the central region of the spin chuck, and
a plurality of second connection members connected between ends of the plurality of second sub-transfer members.

14. The spin coater of claim 11, wherein
the four first transfer members and the four second transfer members extend in a cross shape, and
angles between the four first transfer members are substantially the same as angles between the four second transfer members.

15. The spin coater of claim 11, wherein the four first transfer members and the four second transfer members each comprise a sold pipe.

16. The spin coater of claim 11, wherein the four first transfer members and the four second transfer members each comprise a heat pipe.

17. A spin coater comprising:
a spin chuck configured to make contact with a central region of a lower surface of a substrate, the spin chuck configured to rotate the substrate when photoresist is on the substrate;
a nozzle over a central region of the spin chuck and configured to provide a central region of an upper surface of the substrate with the photoresist;
a first temperature controller configured to control a temperature of an edge region of the spin chuck;
a second temperature controller configured to control a temperature of the central region of the spin chuck;
a thickness sensor configured to measure a thickness of the photoresist on the upper surface of the substrate; and
a main controller configured to control operations of the first temperature controller and the second temperature controller in accordance with the thickness of the photoresist measured by the thickness sensor,
wherein the first temperature controller includes
four first non-contact type power supply devices spaced apart from each other by a same gap with respect to a center of the spin chuck,
four first thermoelectric elements in the spin chuck, the four first thermoelectric elements configured to receive a first power from the four first non-contact type power supply devices, respectively, and configured to generate a first hot air or cold air, and
four first transfer members extending from the center of the spin chuck and connected between the four first thermoelectric elements and the edge region of the spin chuck, the four first transfer members configured to transfer the first hot air or cold air to the edge region of the spin chuck, and wherein the second temperature controller includes
four second non-contact type power supply devices spaced apart from each other by a same gap amount with respect to the center of the spin chuck,
four second thermoelectric elements in the spin chuck, the four second thermoelectric elements configured to receive a second power from the four second non-contact type power supply devices, respectively, and configured to generate a second hot air or cold air, and
four second transfer members extending from the center of the spin chuck between the four first transfer members, respectively, and connected between the four second thermoelectric elements and the central region of the spin chuck, the four second transfer members configured to transfer the second hot air or cold air to the central region of the spin chuck, wherein each of the four first non-contact type power supply devices comprises
a first power transmitter positioned by the spin chuck, and
a first power receiver in the spin chuck, the first power receiver electrically connected with a corresponding first thermoelectric element among of the four first thermoelectric elements and configured to receive the first power from the first power transmitter, and wherein each of the four second non-contact type power supply devices comprises:
a second power transmitter by the spin chuck, and
a second power receiver in the spin chuck, the second power receiver electrically connected with the a corresponding second thermoelectric element among the four second thermoelectric elements and configured to receive the second power from the second power transmitter, wherein each of the four first transfer members comprises
a first main transfer member extending from the center of the spin chuck into the edge region of the spin chuck along a radial direction of the spin chuck,
a plurality of first sub-transfer members extending from the first main transfer member into the edge region of the spin chuck, and
a plurality of first connection members connected between ends of the plurality of first sub-transfer members, and wherein each of the four second transfer members comprises
a second main transfer member extending from the center of the spin chuck into the central region of the spin chuck along the radial direction of the spin chuck,
a plurality of second sub-transfer members extending from the second main transfer member into the central region of the spin chuck, and
a plurality of second connection members connected between ends of the plurality of second sub-transfer members.

18. The spin coater of claim 17, wherein
the four first transfer members and the four second transfer members extend in a cross shape, and
angles between the four first transfer members are substantially the same as angles between the four second transfer members.

* * * * *